(12) United States Patent
Fan

(10) Patent No.: US 9,829,867 B2
(45) Date of Patent: Nov. 28, 2017

(54) FAN CONTROL SYSTEM AND METHOD THEREOF

(71) Applicant: Celestica Technology Consultancy (Shanghai) Co., Ltd., Shanghai (CN)

(72) Inventor: Yaoyin Fan, Shanghai (CN)

(73) Assignee: Celestica Technology Consultancy (Shanghai) Co., Ltd., Shanghai (CN)

( * ) Notice: Subject to any disclaimer, the term of this patent is extended or adjusted under 35 U.S.C. 154(b) by 644 days.

(21) Appl. No.: 14/485,597

(22) Filed: Sep. 12, 2014

(65) Prior Publication Data

US 2016/0076544 A1   Mar. 17, 2016

(51) Int. Cl.
  *G05B 11/42*   (2006.01)
  *F04D 27/00*   (2006.01)
  *H05K 7/20*   (2006.01)

(52) U.S. Cl.
  CPC ............ *G05B 11/42* (2013.01); *F04D 27/004* (2013.01); *H05K 7/207* (2013.01); *H05K 7/20209* (2013.01); *H05K 7/20836* (2013.01); *H05K 7/20709* (2013.01)

(58) Field of Classification Search
  CPC ... F04D 27/004; G05B 11/42; H05K 7/20209; H05K 7/220836; H05K 7/207; H05K 7/20709; H05K 7/20836
  See application file for complete search history.

(56) References Cited

U.S. PATENT DOCUMENTS

| | | | | |
|---|---|---|---|---|
| 5,777,897 A * | 7/1998 | Giorgio | ............... | F24F 11/0079 700/299 |
| 6,134,667 A * | 10/2000 | Suzuki | ................... | G06F 1/206 318/471 |
| 8,669,725 B2 * | 3/2014 | Wu | ......................... | G06F 1/206 318/268 |
| 8,868,944 B2 * | 10/2014 | Refai-Ahmed | ........ | G06F 1/206 713/300 |
| 8,899,911 B2 * | 12/2014 | Chou | .................... | F04D 25/166 415/1 |
| 9,192,076 B2 * | 11/2015 | Artman | ..................... | G06F 1/20 |
| 9,405,301 B2 * | 8/2016 | Montero | ................. | G06F 1/206 |
| 2004/0027799 A1* | 2/2004 | King | ....................... | G06F 1/206 361/679.48 |

(Continued)

*Primary Examiner* — Jennifer L Norton
(74) *Attorney, Agent, or Firm* — Nixon Peabody LLP

(57) ABSTRACT

Provided are a fan control method and a fan control system. The fan control method of the present invention includes the steps of predetermining a reliable operating temperature of a hard disk; creating a storing a corresponding relationship between an average hard disk temperature and a fan speed, and creating and storing a corresponding relationship between a hard disk temperature greater than the reliable operating temperature and a fan speed; reading actual temperatures of the plurality of hard disks; comparing the actual temperatures of the plurality of hard disks with the reliable operating temperature; computing an average temperature of the plurality of hard disks; and outputting a control signal to adjust the fan speed based on the stored corresponding relationship between an average hard disk temperature and a fan speed. Accordingly, the present invention may increase hard disk reliability and decrease power dissipation of a fan and system noise.

10 Claims, 3 Drawing Sheets

(56) References Cited

U.S. PATENT DOCUMENTS

| | | | | |
|---|---|---|---|---|
| 2006/0229851 A1* | 10/2006 | Cannon | ............... | G07C 5/008 |
| | | | | 702/193 |
| 2007/0296408 A1* | 12/2007 | Liao | ............... | G05D 23/1931 |
| | | | | 324/224 |
| 2008/0237361 A1* | 10/2008 | Wang | ............... | F24F 11/0079 |
| | | | | 236/49.3 |
| 2010/0228403 A1* | 9/2010 | Eto | ............... | G05D 23/1931 |
| | | | | 700/300 |
| 2011/0029151 A1* | 2/2011 | Tang | ............... | G05D 23/1917 |
| | | | | 700/300 |
| 2011/0077794 A1* | 3/2011 | Ahuja | ............... | G01K 3/06 |
| | | | | 700/300 |
| 2013/0147411 A1* | 6/2013 | Pang | ............... | G11B 33/144 |
| | | | | 318/452 |
| 2013/0170134 A1* | 7/2013 | Shih | ............... | H05K 7/20836 |
| | | | | 361/679.48 |
| 2013/0229765 A1* | 9/2013 | Weng | ............... | G06F 1/206 |
| | | | | 361/679.33 |
| 2014/0172185 A1* | 6/2014 | Sankar | ............... | F24F 11/0079 |
| | | | | 700/300 |
| 2014/0294583 A1* | 10/2014 | Yu | ............... | F04D 27/004 |
| | | | | 416/1 |
| 2015/0286262 A1* | 10/2015 | Park | ............... | G05D 23/1917 |
| | | | | 713/320 |
| 2017/0082111 A1* | 3/2017 | Barron | ............... | F04D 27/004 |

\* cited by examiner

FAN CONTROL SYSTEM AND METHOD THEREOF

BACKGROUND OF THE INVENTION

1. Field of the Invention

The present invention relates generally to large capacity hard disks, and more particularly, to a fan control method and a fan control system for cooling down hard disks.

2. The Prior Arts

With the development of networks, the server performance of network devices is constantly improved. Accordingly, storage devices for storing data are continuously improved. The storage devices together with servers are used to store network data, such that both of them are installed in a machine. Also, the exterior of the storage devices is similar to that of servers. Both include an enclosure and a front panel on the front of the enclosure. When an enclosure is installed in a machine, the front panel of the enclosure may be operated by users. The storage devices may be hard disks. A capacity of a storage device may have a number of hard disks. Generally, a large capacity hard disk may have strong data access performances.

However, when a storage device has a number of large capacity hard disks, temperatures of the hard disks must be considered. The electronic components of each hard disk may create heat when accessing data. Therefore, a number of large capacity hard disks may create more heat. As such, when a machine includes an array of hard disks, heat dissipation becomes extremely important.

Generally speaking, a large capacity storage system may include 2.5-inch/3.5-inch drives or hard disks, a number of fans, a power supply and a control panel. Nowadays, a number of fans are used to cool down an array of hard disks. Accordingly, power dissipation of a storage device is increased due to a large number of hard disks installed. Cooling fans should provide sufficient amount of wind for the storage device to ensure that the storage device may work properly. Additionally, fan power dissipation is directly proportional to a cube of a fan speed.

In order to increase a large storage capacity and improve the competiveness of products, a large number of hard disks are required to install. Moreover, cooling fans should provide sufficient amount of wind for a storage device to ensure that the storage device may work properly below a reliable operating temperature 50° C. such as 0~40° C. Common heat management of a storage device is to adjust a fan speed based on ambient temperature so as to ensure that all the hard disks work below a specific temperature. However, the above method does not consider power dissipation of each of hard disks with respect to different types and different operating states of hard disks, thereby enabling the storage device to be overcooled down. Therefore, in order to achieve low power dissipation and low system noise, there is a need for a solution that overcomes the aforementioned prior-art issues.

SUMMARY OF THE INVENTION

In light of the foregoing drawbacks, an objective of the present invention is to provide a fan control method and a fan control system, thereby overcoming the problems of high power dissipation and noise of hard disks.

For achieving the foregoing objective, the present invention provides a fan control method for cooling down an electronic device having a plurality of hard disks by using a plurality of fans corresponding to the plurality of hard disks, including the steps of predetermining a reliable operating temperature of a hard disk; creating and storing a corresponding relationship between an average hard disk temperature and a fan speed, and creating and storing a corresponding relationship between a hard disk temperature greater than the reliable operating temperature and a fan speed; reading actual temperatures of the plurality of hard disks; comparing the actual temperatures of the plurality of hard disks with the reliable operating temperature and determining whether the actual temperatures of the plurality of hard disks are greater than the reliable operating temperature, wherein if the actual temperatures of the plurality of hard disks are not greater than the reliable operating temperature, proceed to a first determination result, but if the actual temperature of the plurality of hard disks are greater than the reliable operating temperature, proceed to a second determination result; and computing an average temperature of the plurality of hard disks and outputting a first control signal to adjust the fan speed based on the stored corresponding relationship between an average hard disk temperature and a fan speed when the first determination result is conducted; otherwise, outputting a second control signal to adjust the fan speed based on the stored corresponding relationship between a hard disk temperature greater than the reliable operating temperature and a fan speed when the second determination result is conducted.

Preferably, the present invention further includes a step of setting an initial fan speed.

Preferably, a minimum value of the average hard disk temperature is predetermined when the corresponding relationship between an average hard disk temperature and a fan speed is created and stored; and the fan speed is 30% of a maximum fan speed when a hard disk temperature is smaller than the minimum value of the average hard disk temperature.

Preferably, when the corresponding relationship between a hard disk temperature greater than the reliable operating temperature and a fan speed, the hard disk temperature corresponds to a maximum fan speed.

Preferably, when the second determination result is conducted, the fan speed is increasing until it reaches the maximum fan speed by means of PID control algorithm: fan speed(k)=fan speed(k−1)+Kp×(T(k)−T(k−1))+Ki×(T(k)−50)+Kd×(T(k)−2×T(k−1)+T(k−2)), where k is a time status parameter; fan speed(k) is fan speed at time k; fan speed (k−1) is fan speed at time k−1; T(k), T(k−1) and T(k−2) are average hard disk temperatures at times k, k−1 and k−2, respectively; and Kp, Ki and Kd are ratio coefficient, integral coefficient and differential coefficient, respectively.

According to the present invention, the present invention further provides a fan control system for cooling down an electronic device having a plurality of hard disks by using a plurality of fans corresponding to the plurality of hard disks. The fan control system includes a plurality of temperature sensors corresponding to a plurality of hard disks and detecting actual temperatures of the plurality of hard disks; a temperature reading unit having a plurality of input/output ports that are connected to the plurality of temperatures sensors and reading the actual temperatures detected by the plurality of temperature sensors; a reliable operating temperature preset unit predetermining a reliable operating temperature of a hard disk; a storage unit creating and storing a first relationship table based on a corresponding relationship between an average hard disk temperature and a fan speed, and creating and storing a second relationship table based on a corresponding relationship between a hard disk temperature greater than the reliable operating temperature and a fan speed; a temperature comparing unit connected to the temperature reading unit and the reliable operating temperature preset unit, comparing the actual temperatures of the plurality of hard disks with the reliable operating temperature and determining whether the actual temperatures of the plurality of hard disks are greater than the reliable operating temperature, wherein if the actual temperatures of the plurality of hard disks are not greater than the reliable operating temperature, proceed to a first determination result, but if the actual temperatures of the plurality of hard disks are greater than the reliable operating temperature, proceed to a second determination result; an average temperature computing unit computing an average of the plurality of hard disks based on the actual temperatures of the plurality of hard disks when the first determination result is conducted; and an output control unit outputting a first control signal to adjust the fan speed based on the first relationship table in accordance with the stored corresponding relationship between an average hard disk temperature and a fan speed when the first determination result is conducted; otherwise, outputting a second control signal to adjust the fan speed based on the second relationship table in accordance with the stored corresponding relationship between a hard disk temperature greater than the reliable operating temperature and a fan speed when the second determination result is conducted.

Preferably, the present invention further includes an initialization unit that sets an initial fan speed.

Preferably, the first relationship table predetermines a minimum value of the average hard disk temperature, and the fan speed is 30% of a maximum fan speed when a hard disk temperature is smaller than the minimum value of the average hard disk temperature.

Preferably, the second relationship table includes that the hard disk temperature corresponds to a maximum fan speed.

Preferably, when the second determination result is conducted, the fan speed is increasing until it reaches the maximum fan speed by means of PID control algorithm: fan speed(k)=fan speed(k−1)+Kp×(T(k)−T(k−1))+Ki×(T(k)−50)+Kd×(T(k)−2×T(k−1)+T(k−2)), where k is a time status parameter; fan speed(k) is fan speed at time k; fan speed (k−1) is fan speed at time k−1; T(k), T(k−1) and T(k−2) are average hard disk temperatures at times k, k−1 and k−2, respectively; and Kp, Ki and Kd are ratio coefficient, integral coefficient and differential coefficient, respectively.

As described above, the fan control method and the fan control system have the following technical effects.

The present may predetermine a reliable operating temperature of a hard disk such that the present invention may increase hard disk reliability and reduce power dissipation and system noise of a fan. Additionally, the present invention may also increase the lifetime of hard disks, reduce power dissipation of hard disks, increase efficiency of electronic devices, and also improve the performance of hard disks.

BRIEF DESCRIPTION OF THE DRAWINGS

The present invention will be apparent to those skilled in the art by reading the following detailed description of a preferred embodiment thereof, with reference to the attached drawings, in which.

DETAILED DESCRIPTION OF THE PREFERRED EMBODIMENT

The accompanying drawings are included to provide a further understanding of the invention, and are incorporated in and constitute a part of this specification. The drawings illustrate embodiments of the invention and, together with the description, serve to explain the principles of the invention.

Figure 1:
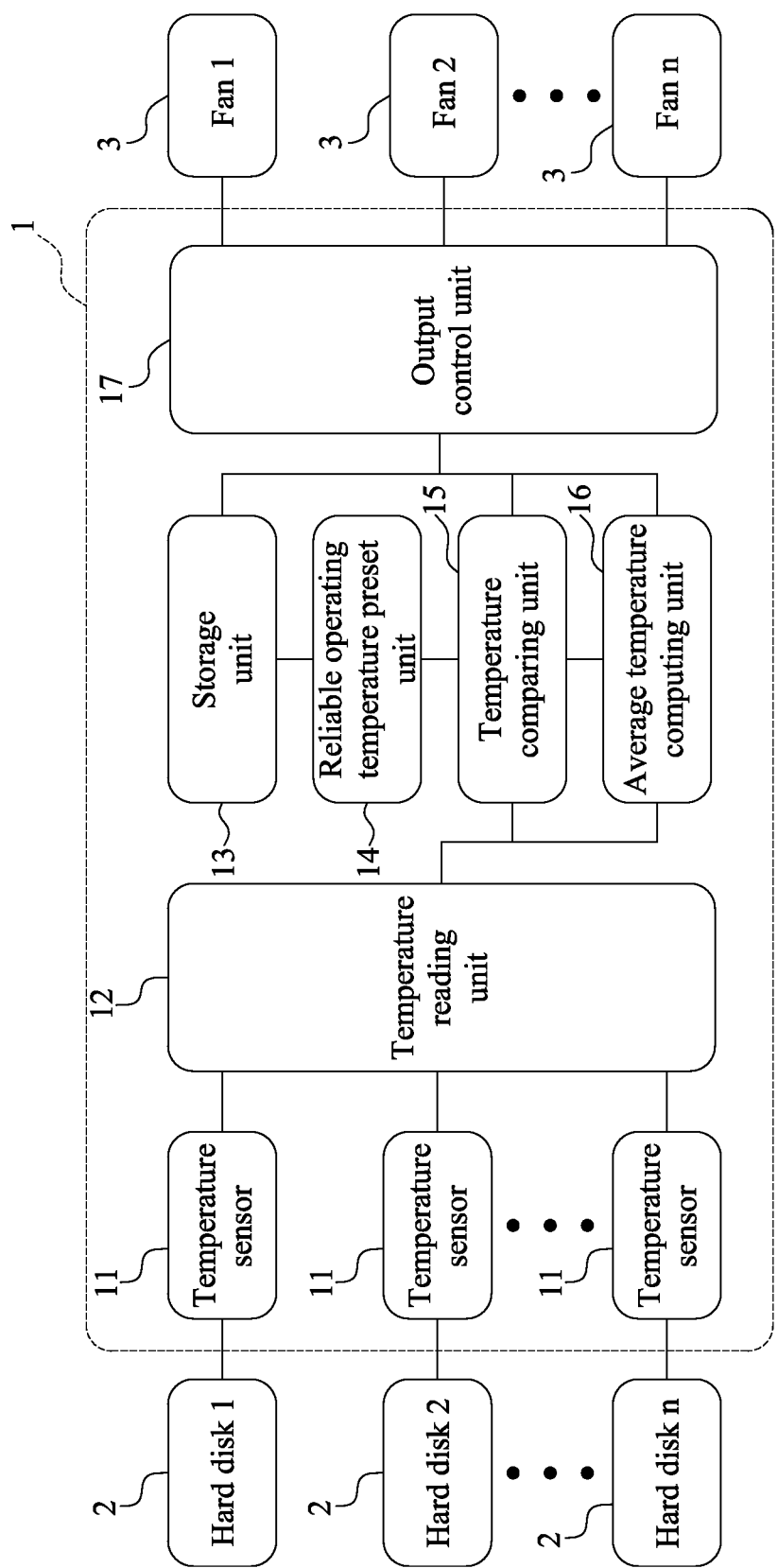
FIG. 1 is a block diagram illustrating a fan control system according to the present invention.
Figure 2:
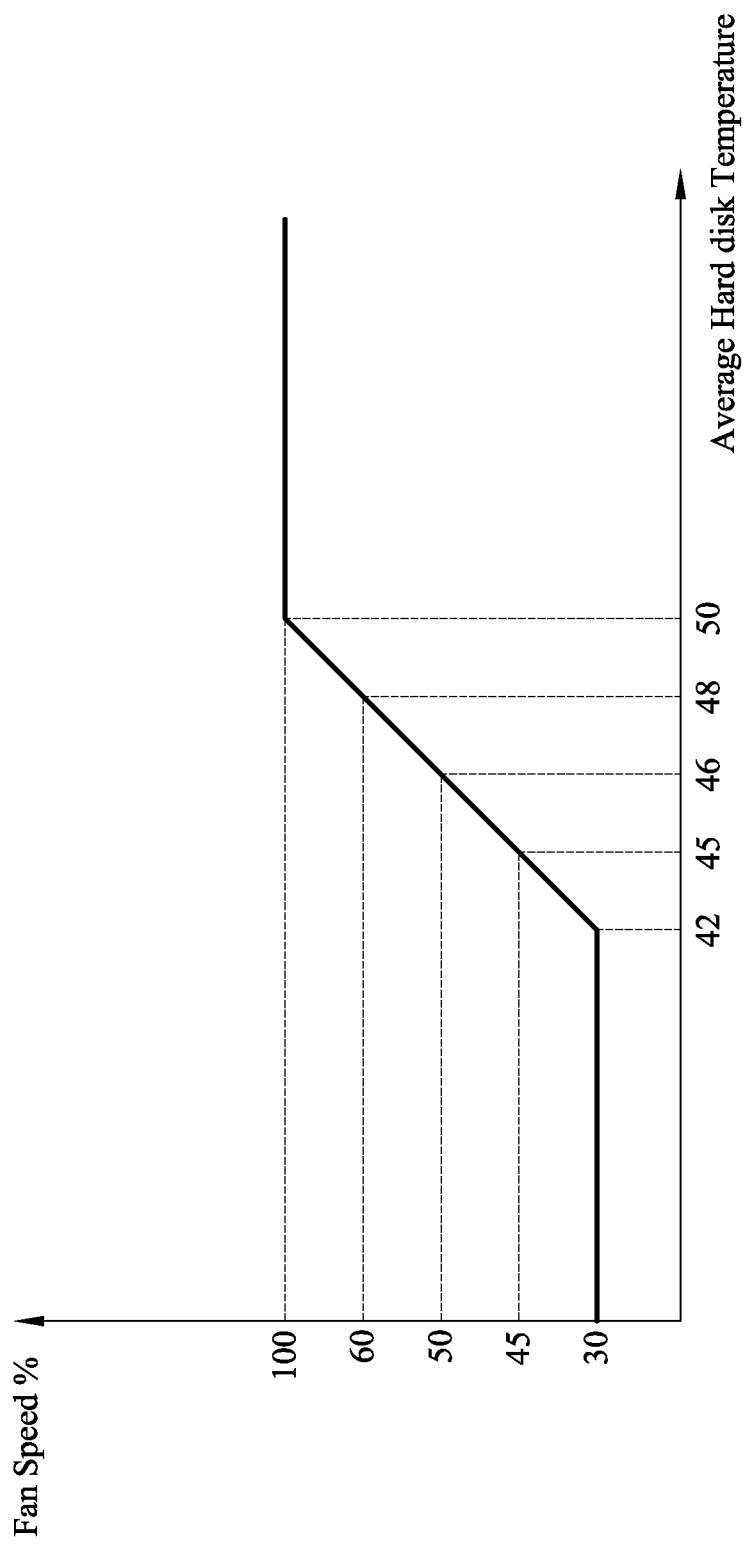
FIG. 2 is a line chart of a first relationship table showing a corresponding relationship between an average hard disk temperature and a fan speed according to the present invention.
Figure 3:
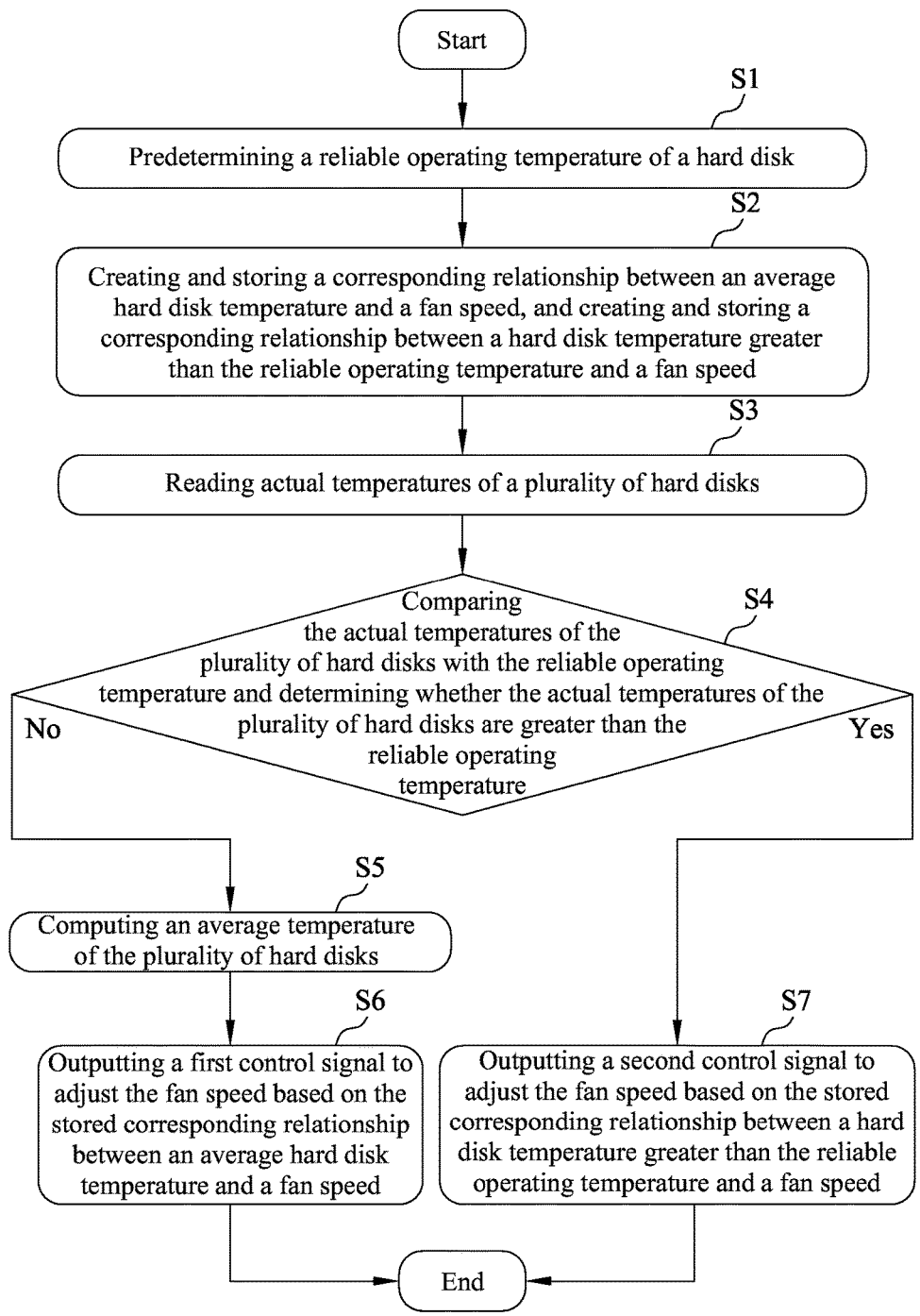
FIG. 3 is a flow chart showing a fan control method according to the present invention.

With regard to FIGS. 1-3, the drawings showing embodiments are semi-diagrammatic and not to scale and, particularly, some of the dimensions are for clarity of presentation and are shown exaggerated in the drawings. Similarly, although the views in the drawings for ease of description generally show similar orientations, this depiction in the drawings is arbitrary for the most part. Generally, the present invention can be operated in any orientation.

In order to increase a large storage capacity and improve the competiveness of products, a large number of hard disks are required to install. Moreover, cooling fans should provide sufficient amount of wind for a storage device to ensure that the storage device may work properly below a reliable operating temperature 50° C. such as 0~40° C. Common heat management of a storage device is to adjust a fan speed based on ambient temperature so as to ensure that all the hard disks work below a specific temperature. However, the above method does not consider power dissipation of each hard disk with respect to different types and different operating states of hard disks, thereby enabling the storage device to be overcooled down. Therefore, in order to achieve low power dissipation and low system noise, there is a need for a solution that overcomes the aforementioned prior-art issues.

In light of the foregoing drawings, an objective of the present invention provides a fan control system and a fan control method. The present invention is aimed to reduce power dissipation and system noise of a fan and increase the lifetime of hard disks. The following fan control system and the method thereof are described in sufficient detail to enable those skilled in the art to make and use the present invention. It is to be understood that other embodiments would be evident based on the present invention, and that system or mechanical changes may be made without departing from the scope of the present invention.

Referring to FIG. 1, a block diagram of a fan control system for cooling down an electronic device is shown. As shown in FIG. 1, the present invention provides a fan control system for cooling down an electronic device having a plurality of hard disks 2 by using a plurality of fans 3 corresponding to the plurality of hard disks 2, including a plurality of temperature sensors 11, a temperature reading unit 12, a reliable operating temperature preset unit 14, a storage unit 13, a temperature comparing unit 15, an average temperature computing unit 16 and an output control unit 17.

In the following description, numerous specific details are given to provide a thorough understanding of the fan control system of the present invention.

The plurality of temperature sensors 11 corresponds to the plurality of hard disks 2, and detects actual temperatures of the plurality of hard disks 2. In other words, each of the plurality of temperature sensors 11 corresponds to each of the plurality of hard disks 2.

The plurality of temperature sensors 11 may be patch-typed temperature sensors which are attached to the surfaces of hard disks. In addition, the plurality of temperature sensors 11 may sense the temperatures of the plurality of hard disks 2 in other manners. For example, the plurality of temperature sensors 11 may be disposed next to the plurality of hard disks so as to sense the temperatures of the plurality of hard disks 2. All temperature sensors capable of sensing the temperatures of hard disks may be used in the present invention.

According to the present invention, the plurality of temperature sensors 11, the temperature reading unit 12, the reliable operating temperature preset unit 14, the storage unit 13, the temperature comparing unit 15, the average temperature computing unit 16 and the output control unit 17 may be disposed in a controller. Moreover, the reliable operating temperature preset unit 14, the storage unit 13, the temperature comparing unit 15 and the average temperature computing unit 16 may be achieved by means of PC software programming.

The temperature reading unit 12 may have a plurality of input/output ports that are connected to the plurality of temperature sensors 11, and read the actual temperatures detected by the plurality of temperature sensors 11. In addition, the temperature reading unit 12 may read the actual temperatures detected by the plurality of temperature sensors 11 by means of a serial port.

The reliable operating temperature preset unit 14 may predetermine a reliable operating temperature of a hard disk 2. For example, hard disks 2 may work at a reliable operating temperature such as 0~40° C. As such, the reliable operating temperature may be determined based on ambient temperature and the hard disk manual. In the present invention, the reliable operating temperature may be a specific temperature such as 50° C., not a range of temperature.

The storage unit 13 may create and store a first relationship table based on a corresponding relationship between an average hard disk temperature and a fan speed and a second relationship table based on a corresponding relationship between a hard disk temperature greater than the reliable operating temperature and a fan speed.

The first relationship table and the second relationship table may be a two-dimensional look-up table. For example, the first relationship table may have two columns. One column may record the average hard disk temperatures, and another column may record their corresponding fan speeds. Additionally, the second relationship table may also have two columns. One column may record the hard disk temperatures greater than the reliable operating temperature, and another column may record their corresponding fan speeds.

Referring to FIG. 2, a line chart of the first relationship table based on a corresponding relationship between an average hard disk temperature and a fan speed is illustrated. For example, a linear function y=5x−180, where x is an average hard disk temperature, and y is a ratio of fan speed to maximum fan speed. Accordingly, the first relationship table may record specific fan speeds. Further, a general formula of a linear control function y=ax−b may be determined based on coefficients a and b.

According to the embodiment of the present invention, it should be noted that the first relationship table predetermines a minimum value of the average hard disk temperature. As such, if a temperature is less than the minimum value of the average hard disk temperature, it corresponds to 30% of a maximum fan speed. In other words, when a temperature is less than the minimum value of the average hard disk temperature, it may correspond to 30% of a maximum fan speed due to a minimum value of the average hard disk temperature is predetermined by the first relationship table. Therefore, if a temperature is less than the minimum value of the average hard disk temperature, the fan speed may not decrease in pace of the temperature, and may correspond to a fixed value.

Similarly, in the embodiment of the present invention, the second relationship table records a maximum fan speed. That is to say, if a hard disk temperature is greater than the reliable operating temperature, the fan may work at a maximum fan speed.

The temperature comparing unit 15 is connected to the temperature reading unit 12 and the reliable operating temperature preset unit 14. The actual temperatures of the plurality of hard disks 2 are compared with the reliable operating temperature of each of the plurality of hard disks 2. It is determined whether the actual temperatures of the plurality of hard disks are greater than the reliable operating temperature; if not, a first determination result is conducted; if so, a second determination result is conducted. For example, a reliable operating temperature is 50° C. The temperature comparing unit 15 may determine whether the actual temperatures of the plurality of hard disks 2 are greater than the reliable operating temperature 50° C. Once the actual temperature of one of the plurality of hard disks 2 is greater than 50° C., the second determination result is conducted. In addition, the first determination result is transmitted from the temperature comparing unit 15 to the average temperature computing unit 16 and the output control unit 17, and the second determination result is transmitted from the temperature comparing unit 15 to the output control unit 17.

The average temperature may be computed based on the actual temperatures of the plurality of hard disks while the first determination result (that is, the actual temperatures of the plurality of hard disks 2 are not greater than the reliable operating temperature) is received by the average temperature computing unit 16.

When the first determination result (that is, the actual temperatures of the plurality of hard disks 2) is received by the output control unit 17, a first control signal is outputted to adjust the fan speed based on the first relationship table in accordance with the stored corresponding relationship between the average hard disk temperature and the fan speed.

When the second determination result is received by the output control 17, a second control signal is outputted to adjust the fan speed based on the second relationship table in accordance with the stored corresponding relationship between a hard disk temperature greater than the reliable operating temperature and the fan speed.

Moreover, when the second determination result is conducted, the fan speed is increasing until it reaches the maximum fan speed by means of PID control algorithm: fan speed(k)=fan speed(k−1)+Kp×(T(k)−T(k−1))+Ki×(T(k)−50)+Kd×(T(k)−2×T(k−1)+T(k−2)), where k is a time status parameter; fan speed(k) is fan speed at time k; fan speed (k−1) is fan speed at time k−1; T(k), T(k−1) and T(k−2) are average hard disk temperatures at times k, k−1 and k−2, respectively; and Kp, Ki and Kd are ratio coefficient, integral coefficient and differential coefficient, respectively. In other words, these three coefficients Kp, Ki and Kd are optimized to avoid excessive fan speeds based on system thermal characteristics. Accordingly, the coefficients Kp, Ki and Kd used to control PID are common coefficients for those skilled in the art.

Additionally, it should be noted that if the actual temperatures of the plurality of hard disks 2 are greater than the reliable operating temperature, the output control unit 17 may adjust the fan speed based on the second relationship table in accordance with the stored corresponding relationship between the hard disk temperature greater than the reliable operating temperature and the fan speed.

According to the embodiment of the present invention, the present invention further includes an initialization unit that sets an initial fan speed. However, the initialization unit may not be included if unnecessary. Therefore, the initial fan speed may be determined based on the last fan speed. If a fan never starts working, an initial fan speed may be determined by the initialization unit.

According to the present invention, the present invention further provides a fan control method. The fan control method of the present invention may realize the aforesaid fan control system 1. The fan control method for cooling down an electronic device having a plurality of hard disks 2 by using a plurality of fans corresponding to the plurality of hard disks 2 includes the following steps. A reliable operating temperature of a hard disk 2 may be predetermined. Subsequently, a corresponding relationship between an average hard disk temperature and a fan speed may be created and stored. Also, a corresponding relationship between a hard disk temperature greater than the reliable operating temperature and a fan speed may be created and stored. Actually temperatures of the plurality of hard disks 2 may be read. After that, the actual temperatures of the plurality of hard disks 2 may be compared with the reliable operating temperature, and it is determined whether the actual temperatures of the plurality of hard disks 2 are greater than the reliable operating temperature. If the actual temperatures of the plurality of hard disks 2 are not greater than the reliable operating temperature, proceed to a first determination result. However, if the actual temperatures of the plurality of hard disks 2 are greater than the reliable operating temperature, proceed to a second determination result. Accordingly, an average temperature of the plurality of hard disks 2 may be computed. A first control signal is outputted to adjust the fan 3 speed based on the stored corresponding relationship between an average hard disk temperature and a fan speed when the first determination result is conducted. Otherwise, a second control signal is outputted to adjust the fan 3 speed based on the stored corresponding relationship between a hard disk temperature greater than the reliable operating temperature and a fan speed when the second determination result is conducted. Additionally, the fan control method may also include a step of setting an initial fan speed.

A minimum value of the average hard disk temperature may be predetermined when the corresponding relationship between an average hard disk temperature and a fan speed is created and stored. The fan speed may be 30% of a maximum fan speed when a hard disk temperature is smaller than the minimum value of the average hard disk temperature.

According to the present invention, when the corresponding relationship between a hard disk temperature greater than the reliable operating temperature and a fan speed, the hard disk temperature may correspond to a maximum fan speed. when the second determination result is conducted, the fan speed is increasing until it reaches the maximum fan speed by means of PID control algorithm: fan speed(k)=fan speed(k−1)+Kp×(T(k)−T(k−1))+Ki×(T(k)−50)+Kd×(T(k)−2×T(k−1)+T(k−2)), where k is a time status parameter; fan speed(k) is fan speed at time k; fan speed(k−1) is fan speed at time k−1; T(k), T(k−1) and T(k−2) are average hard disk temperatures at times k, k−1 and k−2, respectively; and Kp, Ki and Kd are ratio coefficient, integral coefficient and differential coefficient, respectively.

If the actual temperatures of the plurality of hard disks 2 are greater than the reliable operating temperature, the output control unit may adjust the fan speed based on the second relationship table in accordance with the stored corresponding relationship between the hard disk temperature greater than the reliable operating temperature and the fan speed.

Referring to FIG. 3, a flow chart of a fan control method for cooling down an electronic device is shown. The foregoing fan control system 1 may be achieved by the fan control method.

In step S1, a reliable operating temperature (such as 50° C.) of a hard disk is predetermined. Then, proceed to step S2.

In step S2, a corresponding relationship between an average hard disk temperature and a fan speed is created and stored, and a corresponding relationship between a hard disk temperature greater than the reliable operating temperature and a fan speed is created and stored. Then, proceed to step S3.

In step S3, actual temperatures of the plurality of hard disks are read. Then, proceed to step S3.

In step S4, the actual temperatures of the plurality of hard disks are compared with the reliable operating temperature, and it is determined whether the actual temperatures of the plurality of hard disks are greater than the reliable operating temperature. If not, proceed to step S5; if so, proceed to step S7.

In step S5, an average temperature of the plurality of hard disks is computed. Then, proceed to step S6.

In step S6, a control signal is outputted to adjust the fan speed based on the stored corresponding relationship between an average hard disk temperature and a fan speed. Then, proceed to an end step.

In step S7, a control signal is outputted to adjust the fan speed based on the stored corresponding relationship between a hard disk temperature greater than the reliable operating temperature and a fan speed.

From the above, it is clear that the fan control system and method of the present invention may solve the abovementioned problem. As such, the present invention may increase hard disk reliability and reduce power dissipation and noise of a fan. Also, the present invention may reduce power consumed by hard disks, increase efficiency of electronic devices, and improve the performance of hard disks.

The above exemplary embodiment describes the principle and effect of the present invention, but is not limited to the present invention. It will be apparent to those skilled in the art that various modifications and variations can be made to the disclosed embodiments. It is intended that the specification and examples be considered as exemplary only, with a true scope of the disclosure being indicated by the following claims and their equivalents.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A fan control method for cooling down an electronic device having a plurality of hard disks by using a plurality of fans, comprising the steps of:
   predetermining a reliable operating temperature of a hard disk;
   creating and storing a first relationship between average hard disk temperatures and corresponding fan speeds;
   creating and storing a second relationship between hard disk temperatures greater than the reliable operating temperature and corresponding fan speeds;
   reading actual temperatures of the plurality of hard disks;
   comparing the actual temperatures of the plurality of hard disks with the reliable operating temperature;
   determining whether the actual temperatures of the plurality of hard disks are greater than the reliable operating temperature, wherein if the actual temperatures of the plurality of hard disks are not greater than the reliable operating temperature, proceed to a first determination result, but if the actual temperatures of the plurality of hard disks are greater than the reliable operating temperature, proceed to a second determination result; and
   computing an average temperature of the plurality of hard disks and outputting a first control signal to adjust a fan speed of a fan based on the stored first relationship between the average temperatures and the corresponding fan speeds when the first determination result is conducted; otherwise, outputting a second control signal to adjust the fan speed of the fan based on the stored second relationship between the hard disk temperatures greater than the reliable operating temperature and the corresponding fan speeds when the second determination result is conducted.

2. The fan control method according to claim 1, further comprising a step of setting an initial fan speed of the fan.

3. The fan control method according to claim 1, wherein a minimum value of the average hard disk temperatures is predetermined when the first relationship between the average hard disk temperatures and the corresponding fan speeds is created and stored; and wherein the fan speed of the fan is 30% of a maximum fan speed when hard disk temperatures are smaller than the minimum value of the average hard disk temperatures.

4. The fan control method according to claim 1, wherein when the second relationship between the hard disk temperatures greater than the reliable operating temperature and the corresponding fan speeds, the hard disk temperatures correspond to a maximum fan speed of the fan.

5. The fan control method according to claim 4, wherein when the second determination result is conducted, the fan speed of the fan is increasing until it reaches the maximum fan speed by means of PID control algorithm: fan speed(k)=fan speed(k−1)+Kp×(T(k)−T(k−1))+Ki×(T(k)−50)+Kd×(T(k)−2×T(k−1)+T(k−2)), where k is a time status parameter; fan speed(k) is fan speed at time k; fan speed(k−1) is fan speed at time k−1; T(k), T(k−1) and T(k−2) are average hard disk temperatures at times k, k−1 and k−2, respectively; and Kp, Ki and Kd are ratio coefficient, integral coefficient and differential coefficient, respectively.

6. A fan control system for cooling down an electronic device having a plurality of hard disks by using a plurality of fans, comprising:
   a plurality of temperature sensors configured to detect actual temperatures of the plurality of hard disks;
   a temperature reading unit having a plurality of input/output ports that are connected to the plurality of temperature sensors and reading the actual temperatures detected by the plurality of temperature sensors;
   a reliable operating temperature preset unit predetermining a reliable operating temperature of a hard disk;
   a storage unit creating and storing a first relationship table based on a first relationship between average hard disk temperatures and corresponding fan speeds, and creating and storing a second relationship table based on a second relationship between hard disk temperatures greater than the reliable operating temperature and corresponding fan speeds;
   a temperature comparing unit connected to the temperature reading unit and the reliable operating temperature preset unit, comparing the actual temperatures of the plurality of hard disks with the reliable operating temperature and determining whether the actual temperatures of the plurality of hard disks are greater than the reliable operating temperature, wherein if the actual temperatures of the plurality of hard disks are not greater than the reliable operating temperature, proceed to a first determination result, but if the actual temperatures of the plurality of hard disks are greater than the reliable operating temperature, proceed to a second determination result;
   an average temperature computing unit computing an average temperature of the plurality of hard disks based on the actual temperatures of the plurality of hard disks when the first determination result is conducted; and
   an output control unit outputting a first control signal to adjust a fan speed of a fan based on the first relationship table in accordance with the stored first relationship between the average hard disk temperatures and corresponding the fan speeds when the first determination result is conducted; otherwise, outputting a second control signal to adjust the fan speed of the fan based on the second relationship table in accordance with the stored second relationship between the hard disk temperatures greater than the reliable operating temperature and the corresponding fan speeds when the second determination result is conducted.

7. The fan control system according to claim 6, further comprising an initialization unit setting an initial fan speed of the fan.

8. The fan control system according to claim 6, wherein the first relationship table predetermines a minimum value of the average hard disk temperatures, and wherein the fan speed of the fan is 30% of a maximum fan speed when hard disk temperatures are smaller than the minimum value of the average hard disk temperatures.

9. The fan control system according to claim 6, wherein the second relationship table comprises that the hard disk temperatures correspond to a maximum fan speed of the fan.

10. The fan control system according to claim 9, wherein when the second determination result is conducted, the fan speed of the fan is increasing until it reaches the maximum fan speed by means of PID control algorithm: fan speed(k)=fan speed(k−1)+Kp×(T(k)−T(k−1))+Ki×(T(k)−50)+Kd×(T(k)−2×T(k−1)+T(k−2)), where k is a time status parameter; fan speed(k) is fan speed at time k; fan speed(k−1) is fan speed at time k−1; T(k), T(k−1) and T(k−2) are average hard disk temperatures at times k, k−1 and k−2, respectively; and Kp, Ki and Kd are ratio coefficient, integral coefficient and differential coefficient, respectively.

* * * * *